US006834017B2

(12) United States Patent
Perner et al.

(10) Patent No.: US 6,834,017 B2
(45) Date of Patent: Dec. 21, 2004

(54) ERROR DETECTION SYSTEM FOR AN INFORMATION STORAGE DEVICE

(75) Inventors: Frederick A. Perner, Palto Alto, CA (US); David Murray Banks, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/264,588

(22) Filed: Oct. 3, 2002

(65) Prior Publication Data

US 2004/0066690 A1 Apr. 8, 2004

(51) Int. Cl.[7] .................................................. G11C 7/02
(52) U.S. Cl. ...................................... 365/209; 365/200
(58) Field of Search ................................... 365/200, 209

(56) References Cited

U.S. PATENT DOCUMENTS

| 5,723,885 A | * | 3/1998 | Ooishi ......................... 257/295 |
| 6,185,143 B1 | | 2/2001 | Perner et al. ................ 365/210 |
| 6,256,247 B1 | | 7/2001 | Perner ......................... 365/209 |
| 6,590,818 B1 | * | 7/2003 | Liston et al. |

* cited by examiner

Primary Examiner—M. Tran

(57) ABSTRACT

An information storage device is disclosed. In one embodiment, the information storage device includes first and second memory cells which store complementary first and second logic states. An error detection system coupled to the first and second memory cells is configured to indicate an error if a difference between a first current flowing through the first memory cell and a second current flowing through the second memory cell is less than a predefined value.

26 Claims, 6 Drawing Sheets

US 6,834,017 B2

ERROR DETECTION SYSTEM FOR AN INFORMATION STORAGE DEVICE

THE FIELD OF THE INVENTION

The present invention generally relates to the field of information storage devices. More particularly, the present invention relates to an error detection system and method for the information storage device.

BACKGROUND OF THE INVENTION

Resistive cross point memory cell arrays include memory cells which store or generate information by affecting a magnitude of a nominal resistance of the memory cells. The memory cells can include polymer elements, magnetic spin dependent tunneling (SDT) junctions or pseudo spin valve (PSV) junctions. The memory cells can also include polysilicon resistors as part of a read-only memory, or floating gate transistors as part of an optical memory, imaging device or floating gate memory device.

A resistive cross point memory cell array that includes magnetic memory cells is referred to as a magnetic random access memory (MRAM). Word lines extend along rows of the magnetic memory cells, and bit lines extend along columns of the magnetic memory cells. Each magnetic memory cell is located at an intersection of a word line and a bit line and typically includes a layer of magnetic film in which the magnetization of the magnetic film is alterable and a layer of magnetic film in which the magnetization is fixed or "pinned" in a particular direction. The magnetic film having alterable magnetization is typically referred to as a data storage layer, and the magnetic film which is pinned is typically referred to as a reference layer.

A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations are referred to as "parallel" and "anti-parallel" orientations. With parallel orientation, the orientation of magnetization in the data storage layer is substantially parallel to the magnetization in the reference layer along the easy axis and the magnetic memory cell is in a low resistance state which can be represented by the value R. With anti-parallel orientation, the orientation of magnetization in the data storage layer is substantially anti-parallel to the magnetization in the reference layer along the easy axis and the magnetic memory cell is in a high resistance state which can be represented by the value R+ΔR. A sense amplifier can be used to sense the resistance state of a selected magnetic memory cell to determine the logic value stored in the memory cell.

Sensing the resistance state of selected magnetic memory cells can be unreliable. Manufacturing variations in the dimensions or shapes or in the thicknesses or crystalline anisotropy of the data storage layers of the magnetic memory cells can cause variations across a wafer in the memory cell R and R+ΔR resistance values, resulting in erroneous memory cell reads.

In one approach, two memory cells are used to improve the reliability of sensing the stored logic state. With this approach, one memory cell stores a desired logic state and the other memory cell stores the opposite logic state. The resistance state is sensed by differentially comparing the resistance of the two memory cells. While this approach can improve sensing reliability and reduce the probability of read errors occurring, sensing the memory cell R and R+ΔR resistance values can still be unreliable because the manufacturing variations do not always affect the resistance values in predictable ways.

SUMMARY OF THE INVENTION

One aspect of the present invention provides an information storage device which includes first and second memory cells which store complementary first and second logic states. An error detection system coupled to the first and second memory cells is configured to indicate an error if a difference between a first current flowing through the first memory cell and a second current flowing through the second memory cell is less than a predefined value.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
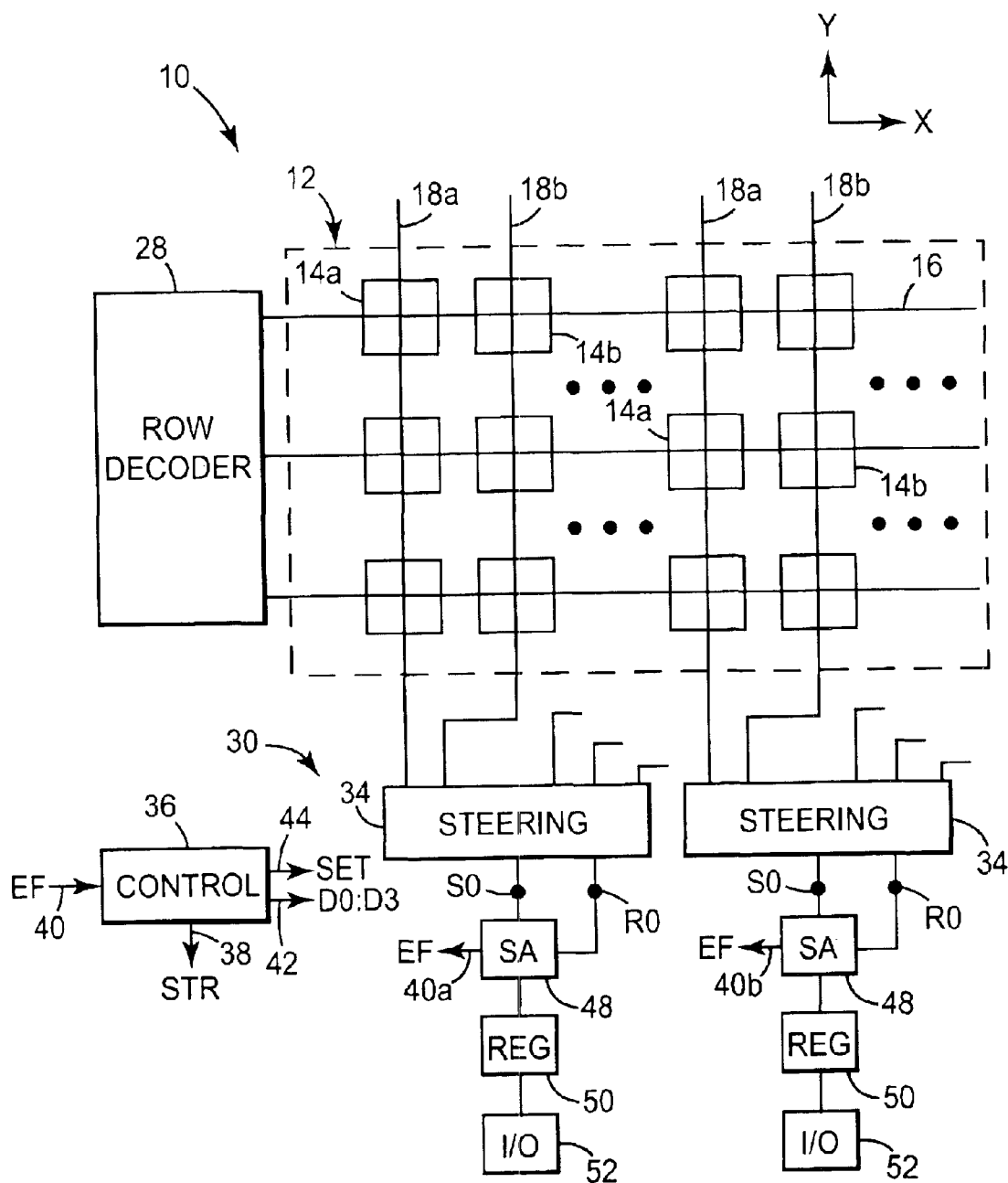
FIG. 1 is a diagram illustrating one exemplary embodiment of an information storage device.

FIG. 1 is a diagram illustrating one exemplary embodiment of an information storage device according to the present invention. In information storage device 10, an error detection system is coupled to a first and second memory cell. The error detection system is configured to indicate a read error if a difference between a first and second current flowing through the first and second memory cell is less than a predefined value.

Information storage device 10 includes a resistive cross point array 12 of memory cells 14a and 14b. The memory cells 14a and 14b are arranged in rows and columns, with the rows extending along an x-direction and the columns extending along a y-direction. Only a relatively small number of memory cells 14a and 14b are shown to simplify the illustration of the information storage device 10.

In the exemplary embodiment, word lines 16 extend along the x-direction in a plane across memory cell array 12. Bit lines 18a and 18b extend along the y-direction in a plane across memory cell array 12. In the exemplary embodiment, there is one word line 16 for each row of the array 12 and one bit line 18a or 18b for each column of the array 12. Each memory cell 14a and memory cell 14b is located at an intersection or cross point of a word line 16 and a bit line 18a or 18b. In other embodiments, there are other suitable numbers of word lines 16 or bit lines 18a or 18b.

The magnetic memory cells 14a or 14b are not limited to any particular type of device. Magnetic memory cells 14a or 14b may be, for example, spin dependent tunneling junction devices, anisotropic magnetoresistance devices, giant magnetoresistance devices, colossal magnetoresistance devices, extraordinary magnetoresistance devices or very large magnetoresistance devices.

In various embodiments, the memory cells 14a and 14b store different information states by using different nominal resistance values for the memory cells. The memory cells can include poly-silicon resistors as part of a read-only memory or can include floating gate transistors. The memory cells can include other types of resistors or transistors.

In the exemplary embodiment, data is stored in memory cells 14a and 14b in a bit-bit bar manner. Two memory cells 14a and 14b are assigned to each bit of data. The memory cell 14a (the data memory cell), stores the value of the bit. The memory cell 14b (the reference memory cell) stores the complement of the value of the bit. Thus, if a data memory cell 14a stores a logic "1", its corresponding reference memory cell 14b stores a logic "0". Each column of data memory cells 14a is coupled to a bit line 18a, and each column of reference memory cells 14b is coupled to a bit line 18b.

Information storage device 10 includes a row decoder 28 for selecting word lines 16 during read and write operations. In one embodiment, the selected word line 16 is connected to ground during a read operation. In one embodiment, a write current is applied to a selected word line 16 during a write operation.

Information storage device 10 includes a read circuit illustrated at 30 for sensing the resistance states of selected memory cells 14a and 14b during read operations. The information storage device 10 also includes a write circuit for supplying write currents to selected word line 16 and bit lines 18a and 18b during write operations. The write circuit is not shown in order to simplify the illustration of information storage device 10.

Read circuit 30 includes one or more steering circuits 34 and sense amplifiers 48. Multiple bit lines 18a and 18b are connected to each steering circuit 34. In other embodiments, other suitable numbers of bit lines 18a and 18b are connected to each steering circuit 34. In the exemplary embodiment, each steering circuit 34 includes a decoder for selecting bit lines. A selected memory cell 14a or 14b lies at the intersection of a selected word line 16 and a selected bit line 18.

During a read operation, selected memory cells 14a and 14b are connected to ground by the selected word line 16. Each steering circuit 34 selects a bit line 18a crossing a column of data memory cells 14a and selects a bit line 18b crossing the corresponding column of reference memory cells 14b. The selected bit lines 18a crossing the columns of data memory cells 14a are coupled to sense nodes S0 of corresponding sense amplifiers 48. The selected bit lines 18b crossing the columns of reference memory cells 14b are coupled to reference nodes R0 of corresponding sense amplifiers 48.

Sense amplifiers 48 determine whether the data read from selected data memory cells 14a is valid. If the data is not valid, sense amplifiers 48 provide an error flag output at 40 which indicates that the data read from corresponding selected data memory cells 14a is not valid. An output of the sense amplifiers 48 is supplied to a data register 50, which, in turn, is coupled to an I/O pad 52 of information storage device 10.

A controller 36 controls read and write operations of information storage device 10. Controller 36 generates a signal STR at 38 which causes the output of sense amplifiers 48 to be strobed into data registers 50. Controller 36 also receives the error flag outputs at 40 and controls subsequent read or write operations based on the status of the error flag outputs 40. Controller 36 includes a data output at 42 to control current levels within sense amplifiers 48 which are used to detect read errors. Although the data output at 42 is illustrated as having four bits (D0:D3), other suitable numbers of bits can be used to control the current levels used to detect the read errors. Controller 36 also includes a SET output at 44 to clock the data at 42 into registers used to control the current levels (see also, FIGS. 8 and 9).

Unselected word lines 16 and bit lines 18a and 18b are coupled to a constant voltage source, wherein the constant voltage source provides an array voltage. In one embodiment, the constant voltage source is provided by an external circuit. In the exemplary embodiment, the sense amplifiers 48 apply the same potential to selected bit lines 18 as the constant voltage source applies to the unselected word lines 16 and bit lines 18a and 18b. This approach of applying equipotential isolation to the array 12 reduces parasitic currents.

The read circuit 30 reads out data in m-bit words, wherein the resistance states of a number (m) of memory cells 14a and 14b are sensed simultaneously, wherein m is any suitable number which is one or greater. An m-bit word is read out by operating m consecutive sense amplifiers 48.

Figure 2:
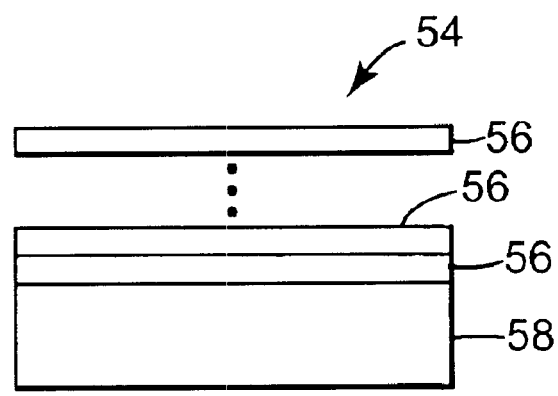
FIG. 2 is a diagram illustrating an exemplary embodiment of an information storage device which includes multiple resistive cross point memory cell arrays stacked on a substrate.

FIG. 2 is a diagram illustrating an exemplary embodiment of an information storage device 54 which includes multiple resistive cross point memory cell arrays 56 stacked on a substrate 58. The memory cell arrays 56 are each separated by an insulating material (not shown) such as silicon dioxide. In various embodiments, suitable circuits such as read and write circuits are fabricated in the substrate 58 and control read or write operations within the memory cell arrays 56. In various embodiments, the read and write circuits include additional multiplexers for selecting specific memory cell arrays 56 that are written to and read from.

Figures 3A, 3B:
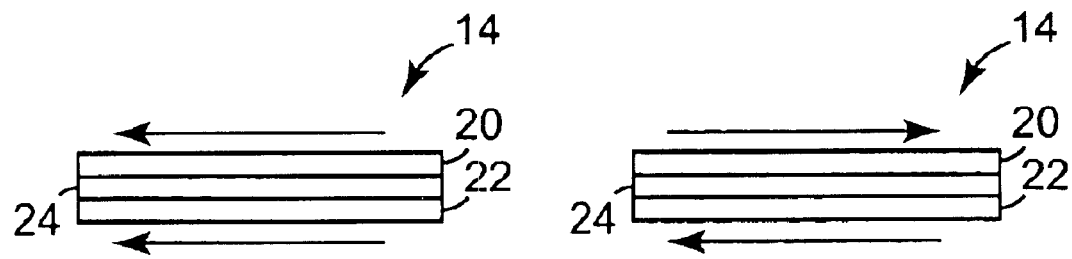
FIGS. 3A and 3B are diagrams illustrating parallel and anti-parallel magnetization for an exemplary embodiment of an information storage device which uses magnetic memory cells.

FIGS. 3A and 3B are diagrams illustrating parallel and anti-parallel magnetization for an exemplary embodiment of an information storage device which uses magnetic memory cells 14. Memory cells 14a and 14b are collectively referred to as memory cells 14. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 3A illustrates by arrows a "parallel" orientation when the magnetization of the free and pinned layers 20 and 22 are in the same direction. FIG. 3B illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cell 14 is a first value R if the orientation of magnetization of the free and pinned layers 20 and 22 is parallel as illustrated in FIG. 3A. The resistance of magnetic memory cell 14 is increased to a second value R+ΔR when the orientation of magnetization is changed from parallel to anti-parallel as illustrated in FIG. 3B.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

Figure 4:
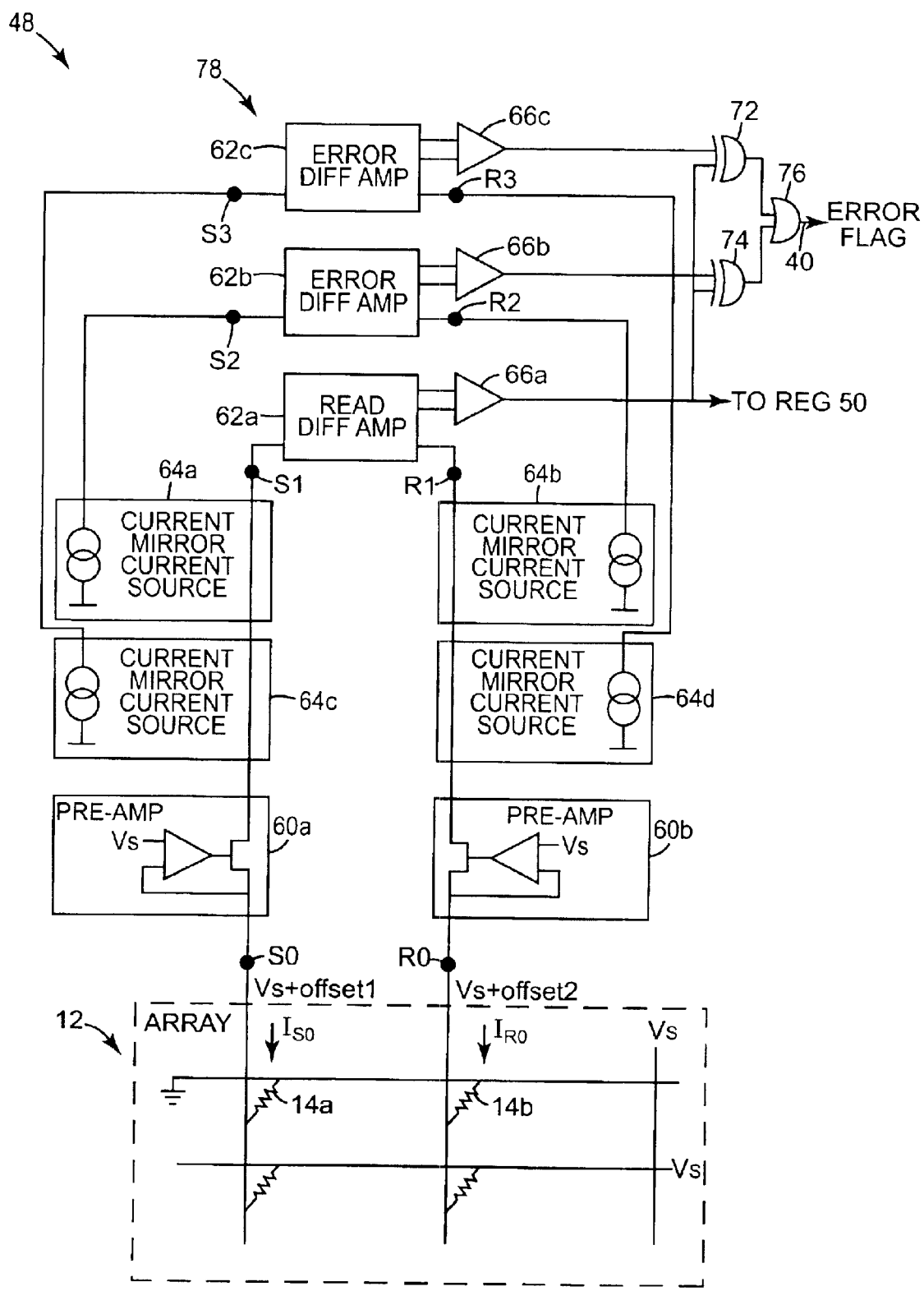
FIG. 4 is a diagram illustrating an exemplary embodiment of a sense amplifier coupled to a resistive cross point memory cell array.

FIG. 4 illustrates an exemplary embodiment of a sense amplifier 48 coupled to selected data and reference memory cells 14a and 14b. Sense amplifier 48 includes a read differential amplifier 62a, a first error differential amplifier 62b and a second error differential amplifier 62c. Each differential amplifier 62 uses the same design to equalize parasitic effects (see also, FIG. 5). Sense amplifier 48 also includes direct injection preamplifiers 60a and 60b for comparing signals at the sense and reference nodes S0 and R0. The comparison indicates the resistance state of selected data memory cells 14a and 14b, and therefore the logic value stored in the selected data memory cell 14a.

Both the selected data memory cell 14a and the selected reference memory cell 14b are represented by resistors. The sense amplifier 48 includes a read differential amplifier 62a having a first input node S1 and a second input node R1. In one embodiment, the read differential sense amplifier 62a is an analog current mode differential sense amplifier. In the exemplary embodiment, the sense amplifier 48 includes a first error differential amplifier 62b having a first input node S2 and a second input node R2. The sense amplifier 48 includes a second error differential amplifier 62c having a first input node S3 and a second input node R3.

Figure 5:
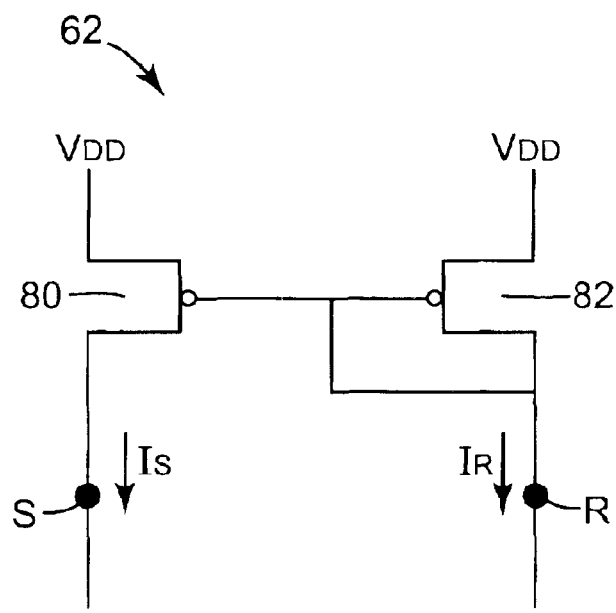
FIG. 5 is a schematic diagram illustrating an exemplary embodiment of the differential amplifiers illustrated in FIG. 4.

FIG. 5 illustrates an exemplary embodiment of the differential sense amplifiers 62 illustrated in FIG. 4. In the exemplary embodiment, the differential sense amplifiers 62 include, respectively, first and second field effect transistors ("FETs") illustrated at 80 and 82. The FETs 80 and 82 together form a mirror current source circuit. In the exemplary embodiment, FET 82 is configured as a p-channel FET and functions as a "reference" or "master" transistor. The FET 80 functions as a "mirror" or "slave" transistor which passes a current which is directly proportional to the current in the reference transistor 82. The current in the mirror transistor 80 is referred to as the mirror current. In the exemplary embodiment, FETs 80 and 82 are complementary metal-oxide semiconductor (CMOS) transistors. In other embodiments the FETs can be formed with other suitable technologies.

In the exemplary embodiment, differential sense amplifiers 62 each amplify a voltage generated at a first input node S. The differential sense amplifiers 62a, 62b and 62c illustrated in FIG. 4 include, respectively, input nodes S1, S2 and S3. In FIG. 5, a voltage $V_R$ at a second input node R is set by a reference current $I_R$ flowing through reference FET 82. The FET 82 gate-to-source voltage is proportional to the current $I_R$ flowing through the reference FET 82, and the voltage falls into a narrow range near the threshold voltage of reference FET 82. The same gate-to-source voltage is applied to the mirror FET 80. If the drain voltage $V_S$ at the first input node S of mirror FET 80 is equal to the drain voltage $V_R$ at the second input node R of the reference transistor 82, the data current or drain current $I_S$ conducted by mirror FET 80 will be the same as the reference current or drain current $I_R$ conducted by reference FET 82.

The configuration of the mirror FET 80 presents a high impedance at the first input node S. When the sense current $I_S$ is not equal to the reference current $I_R$, the voltage $V_S$ at the first input node S will vary in an attempt to satisfy the "mirror" conditions required by FETs 80 and 82. If the sense current $I_S$ is less than the reference current $I_R$, the first input node voltage $V_S$ will rise toward the supply voltage $V_{DD}$. If the sense current $I_S$ is greater than the reference current $I_R$, the first input node voltage $V_S$ will be pulled down to approximately the voltage at node S. In this manner, the current mirror circuit generates a large voltage difference when the sense current $I_S$ is not equal to the reference current $I_R$.

Referring back to FIG. 4, a first (sense) direct injection preamplifier 60a is coupled between the first input node S1 of the differential amplifier 62a and the sense node S0 of the sense amplifier 48. A second (reference) direct injection preamplifier 60b is coupled between the second input node R1 of the differential amplifier 62a and the reference node R0 of the sense amplifier 48. Each direct injection preamplifier 60a and 60b includes a differential amplifier and a transistor operated as a current source. The direct injection preamplifiers 60a and 60b regulate the voltages across the selected memory cells 14a and 14b. The direct injection preamplifiers 60a and 60b are preferably calibrated to minimize differences in their offset voltages (offset1, offset2). The offset voltages (offset1, offset2) should be very close to being equal to each other and should be near zero. Auto calibrating the preamplifiers 60a and 60b minimizes parasitic currents during read operations and reduces the sensing time.

Sense amplifiers 48 can perform sensing in either current mode or voltage mode. This is disclosed in U.S. Pat. No. 6,256,247 to Perner et al., issued Jul. 3, 2001, entitled "Differential Sense Amplifiers for Resistive Cross Point Memory Cell Arrays," which is incorporated herein by reference.

In the exemplary embodiment, the voltage signal out of the differential amplifiers 62 should be large enough to drive comparators 66 to a valid digital level, such as a "1" or a "0". The differential amplifiers 62 amplify a differential voltage across input nodes S and R (the difference between $V_{DD}-V_S$ and $V_{DD}-V_R$) to one logic state when $(V_{DD}-V_S)>(V_{DD}-V_R)$, and to a second logic state when $(V_{DD}-V_S)<(V_{DD}-V_R)$. No time or integration limits are imposed on the differential amplifiers 62 so that the sensing may be performed very quickly. In various embodiments, sending the output of the differential amplifiers 62 through comparators 66 is delayed until all circuit transients have settled and the output has settled to its final valid state.

Logic gates 72, 74 and 76 comprise comparison logic which compares the output of comparators 66b and 66c to the output of comparator 66a. In the exemplary embodiment, logic gate 72 compares the output of comparator 66c to the output of comparator 66a and provides an output to logic gate 76 if the outputs of comparators 66c and 66a are not the same. Logic gate 74 compares the output of comparator 66b to the output of comparator 66a and provides an output to logic gate 76 if the outputs of comparator 66b and 66a are not the same. Logic gate 76 provides an output at 40 which is termed an "error flag" which indicates that either comparator 66b or comparator 66c does not have the same output as comparator 66a. In various embodiments, error flag 40 is provided as an output of each sense amplifier 48 and is used by other logic such as controller 36 to control reading and writing of information storage device 10. In other embodiments, error flag 40 is provided to an output of information storage device 10 or to other logic such as an external memory controller. In the one embodiment, logic gates 72 and 74 are EXCLUSIVE OR logic gates and logic gate 76 is an OR logic gate. In other embodiments, other suitable logic can be utilized to perform the comparison function.

In the embodiment illustrated in FIG. 4, differential amplifiers 62, current sources 64, comparators 66 and logic gates 72, 74 and 76 together comprise an error detection system 78. Error detection system 78 is coupled in the illustrated embodiment to the data and reference memory cells 14a and 14b which are referred to as first memory cell 14a and second memory cell 14b.

In one embodiment, error detection system 78 compares a first current flowing through memory cell 14a to a second current flowing through a memory cell 14b. In the illustrated embodiment, error detection system 78 determines if a difference between the first current and the second current is greater than a predefined threshold value. In this embodiment the predefined value is used to set a minimum difference between the first and second current for which a first or second logic state can be reliably detected. In other embodiments, error detection system 78 can compare other values measured from memory cells 14a and 14b to the predefined threshold values.

In the exemplary embodiment illustrated in FIG. 5, differential sense amplifiers 62 each amplify differences between the currents $I_S$ conducted by FET 80 and $I_R$ conducted by FET 82. Large differences between the resistance of memory cells 14a and 14b which store complementary logic states corresponds to a greater difference between currents $I_S$ and $I_R$. If the difference in resistance, and correspondingly the difference between currents $I_S$ and $I_R$ is not large enough, the differential comparison of the currents by differential amplifiers 62 and comparators 64 becomes unreliable. In the exemplary embodiment, error differential amplifiers 66b and 66c compare the current $I_S$, which is increased by the predefined value or the first predefined amount, to the current $I_R$, or they compare the current $I_R$, which is increased by the predefined value or the second predefined amount, to the current $I_S$. For either logic state stored in memory cell 14a, one of the error differential amplifiers 66b or 66c is comparing a difference in currents which is less than the current difference compared by differential amplifier 66a. This reduced difference in currents is set by current mirrors 64 and corresponds to a minimum difference in currents at which the differential comparison can be reliably performed.

In one embodiment, current sources 64a and 64d are providing currents which are increased from first or second values corresponding, respectively, to the currents flowing through nodes S1 and R1, by the predefined value or by first and second predefined amounts to first or second increased values. Current sources 64a and 64c can alternately be referred to as data current sources as they are coupled through pre-amp 60a to memory cell 14a which stores the first or data logic state. Current sources 64b and 64d can alternately be referred to as reference current sources as they are coupled through pre-amp 60b to memory cell 14b which stores the second or reference logic state which is complementary to the first or data logic state. In this embodiment, current sources 64c and 64b are providing currents equal to the currents flowing through nodes S1 and R1.

In another embodiment, current sources 64c and 64b are providing currents which are increased from first or second values corresponding, respectively, to the currents flowing through nodes S1 and R1, by the predefined value or by first and second predefined amounts to first or second increased values. In this embodiment, current sources 64a and 64d are providing currents equal to the currents flowing through nodes S1 and R1.

In various embodiments, the first and second values are the same. In other embodiments, the first and second values are not the same. In these other embodiments, the first and second values can be individually set to control the response of error differential amplifiers 62b and 62c, and comparators 66b and 66c, as suitably necessary.

In various embodiments, differential amplifiers 62 can perform the comparison in either a current mode or a voltage mode. In one embodiment, the predefined value or the first and second predefined amounts and the first and second increased values correspond to current values when the comparison is in the current mode. In one embodiment, the predefined value or the first and second predefined amounts and the first and second increased values correspond to voltage values when the comparison is in the voltage mode.

In the exemplary embodiment illustrated in FIG. 4, to detect the minimum difference in currents at which the differential comparison can be reliably performed, read differential amplifier 62a compares the currents flowing through nodes S1 and R1 to determine if memory cell 14a is storing the first or second logic state. Read differential amplifier 62a drives comparator 66a to either the first or second logic state which corresponds to the logic state stored in memory cell 14a. Current sources 64a and 64b are mirror current sources which are coupled to nodes S2 and R2 of error differential amplifier 62b. Current sources 64c and 64d are mirror current sources which are coupled to nodes S3 and R3 of error differential amplifier 62c.

In one illustrative embodiment, current source 64a is providing the current to node S2 which is greater than the current flowing through node S1 by the predefined value or first predefined amount. For one of the first and second logic states, error differential amplifier 62b and comparator 66b are comparing a reduced difference in currents to determine if the output of comparator 66b is the same as the output of comparator 66a. When error differential amplifier 62b is detecting a difference in currents which is smaller than the difference in currents detected by read differential amplifier 62a, the predefined value or first predefined amount is set so that the outputs of comparators 66a and 66b are equal when the currents through S1 and R1 have a difference which is above a level which can be reliably detected by differential amplifier 62a.

In a second illustrative embodiment, current source 64b is providing the current to node R2 which is greater than the current flowing through node R1 by the predefined value or second predefined amount. For one of the first and second logic states, error differential amplifier 62b and comparator 66b are comparing a reduced difference in currents to determine if the output of comparator 66b is the same as the output of comparator 66a. When error differential amplifier 62b is detecting a difference in currents which is smaller than the difference in currents detected by read differential amplifier 62a, the predefined value or second predefined amount is set so that the outputs of comparators 66a and 66b are equal when the currents through S1 and R1 have a difference which is above a level which can be reliably detected by differential amplifier 62a.

In a third illustrative embodiment, current source 64c is providing the current to node S3 which is greater than the current flowing through node S1 by the predefined value or first predefined amount. For one of the first and second logic states, error differential amplifier 62c and comparator 66c are comparing a reduced difference in currents to determine if the output of comparator 66c is the same as the output of comparator 66a. When error differential amplifier 62c is detecting a difference in currents which is smaller than the difference in currents detected by read differential amplifier 62a, the predefined value or first predefined amount is set so that the outputs of comparators 66a and 66c are equal when the currents through S1 and R1 have a difference which is above a level which can be reliably detected by differential amplifiers 62a.

In a fourth illustrative embodiment, current source 64d is providing the current to node R3 which is greater than the current flowing through node R1 by the predefined value or second predefined amount. For one of the first and second logic states, error differential amplifier 62c and comparator 66c are comparing a reduced difference in currents to determine if the output of comparator 66c is the same as the output of comparator 66a. When error differential amplifier 62c is detecting a difference in currents which is smaller than the difference in currents detected by read differential amplifier 62a, the predefined value or second predefined amount is set so that the outputs of comparators 66a and 66c are equal when the currents through S1 and R1 have a difference which is above a level which can be reliably detected by differential amplifiers 62a.

Figure 6:
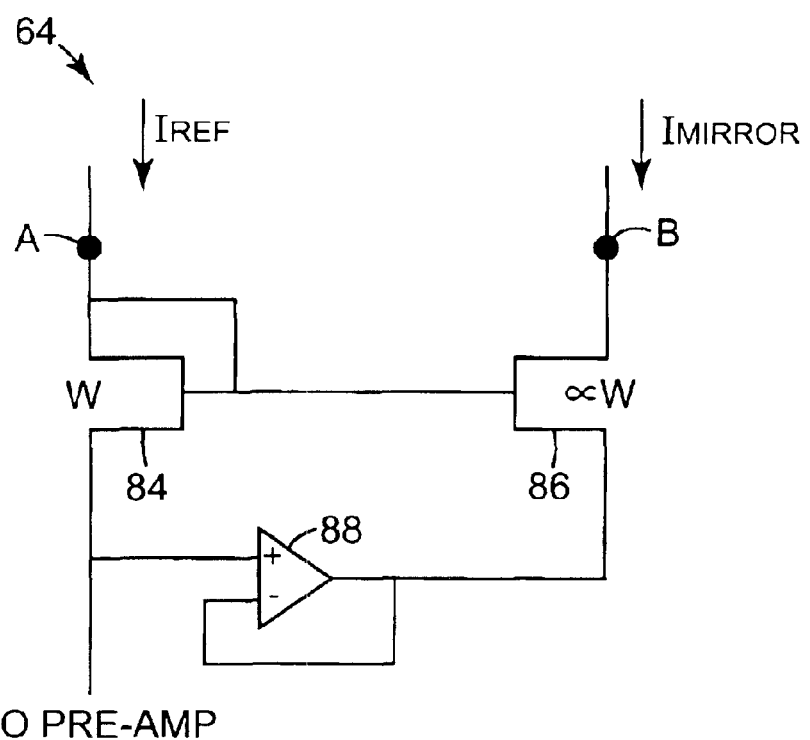
FIG. 6 is a schematic diagram illustrating a first embodiment of the current mirror sources illustrated in FIG. 4.

FIG. 6 is a schematic diagram illustrating a first embodiment of the current mirror sources 64 illustrated in FIG. 4. In the first embodiment, current mirror sources 64 include FET 84 which has a gate width indicated as W and FET 86 which has a gate width equal to $\alpha$ times W. The factor $\alpha$ is any suitable number which is greater than zero. In the first embodiment illustrated in FIG. 6, FETs 84 and 86 are n-channel FET transistors. FETs 84 and 86 have the same gate lengths, and FET 86 has a gate width which is greater than the width of FET 84 by the factor $\alpha$. In this first embodiment, $\alpha$ is greater than one. Operational amplifier 88 controls a source voltage of FET 86 to be equal to a source voltage of FET 84. Because FETs 86 and 84 have the same source voltage and the gate of FET 84 is coupled to a drain of FET 84 at node A, FET 84 conducts a reference current $I_{REF}$ flowing through node A and FET 86 conducts a mirror current $I_{MIRROR}$ flowing through node B which is greater than $I_{REF}$ by a factor corresponding to $\alpha$. Thus if a is equal to one, the mirror current $I_{MIRROR}$ flowing through node B is equal to the reference current $I_{REF}$ flowing through node A. If $\alpha$ is greater than one, the mirror current $I_{MIRROR}$ flowing through node B is greater than the reference current $I_{REF}$ flowing through node A. In other embodiments, $\alpha$ is less than one.

In the illustrated embodiments of current sources 64 in FIG. 4, the reference transistor FET 84 in current mirror 64a is connected from node S1 to the reference transistor FET 84 in current mirror 64c. The source of reference transistor FET 84 in current mirror 64c is connected to the pre-amp 60a. The reference transistor FET 84 in current mirror 64b is connected from node R1 to the reference transistor FET 84 in current mirror 64d. The source of reference transistor FET 84 in current mirror 64d is connected to the pre-amp 60b.

Figure 7:
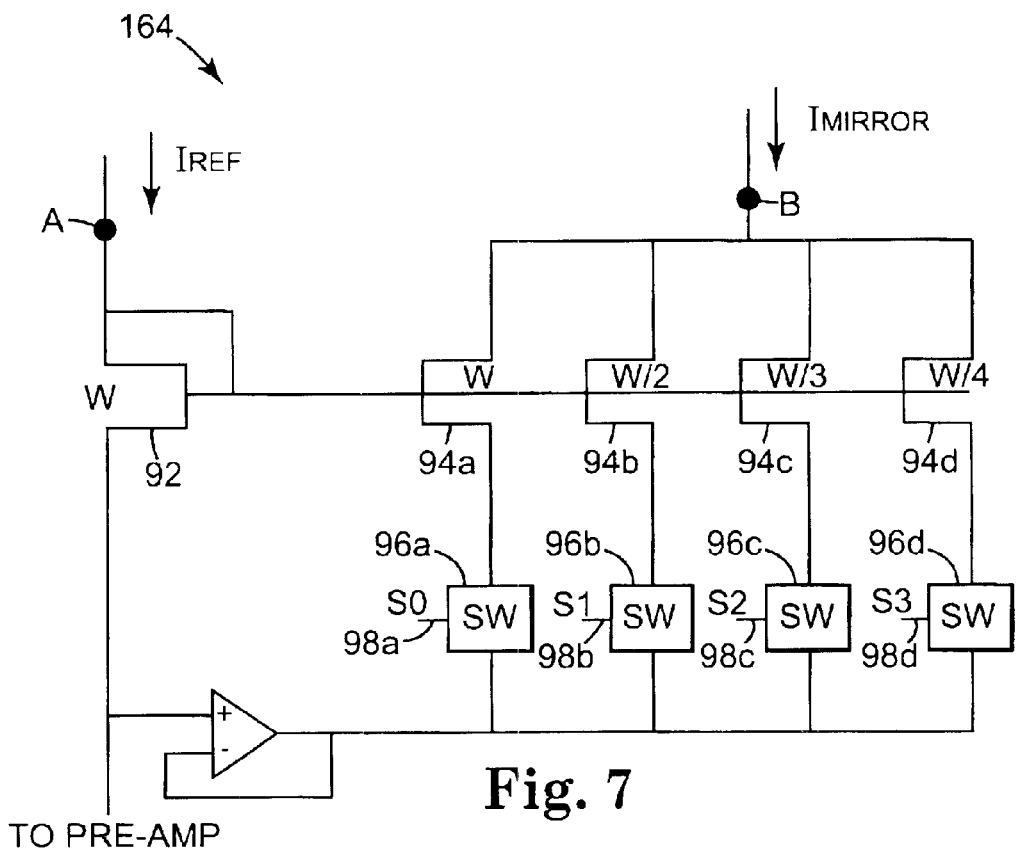
FIG. 7 is a schematic diagram illustrating a second embodiment of the current mirror sources illustrated in FIG. 4.

FIG. 7 is a schematic diagram illustrating a second embodiment of a current mirror source which is illustrated at 164. Various embodiments of the current mirror source 164 illustrated in FIG. 7 can be used to supply the currents to nodes S2, R2, S3 and R3 in FIG. 4. In the second embodiment illustrated in FIG. 7, FET 92 is a reference transistor which conducts the reference current $I_{REF}$. FETs 94 are mirror transistors which conduct currents which sum to the mirror current $I_{MIRROR}$ which is conducted through node B.

The FET 92 is coupled between either pre-amp 60a or 60b and node A which corresponds to either node S1 or node R1. FETs 94 are each coupled to corresponding select switches 96. Select switches 96 are coupled between corresponding FETs 94 and a voltage source which is equal to the source voltage of FET 92, and selectively couple FETs 94 to the voltage source. FETs 94 are also coupled in common to node B so that combinations of selected FETs 94 conduct the mirror current $I_{MIRROR}$ through node B.

The FETs 94 are selectively enabled by switches 96 to supply the mirror current $I_{MIRROR}$ through node B which is less than, equal to, or greater than the reference current through node A. Transistor 94a has a width W, transistor 94b has a width W/2, transistor 94c has a width W/3 and transistor 94d has a width W/4. Because the gate of FET 92 is coupled to a drain of FET 92 at node A, and because FETs 94 are coupled to the voltage equal to the source voltage of FET 92 (see also, FIG. 4), FET 92 conducts a reference current $I_{REF}$ and FETs 94 conduct a mirror current $I_{MIRROR}$ through node B which is proportional to the difference between the gate width W of FET 92 and the sum of the gate widths of the FETs 94 selected to conduct currents.

In the second embodiment illustrated in FIG. 7, switches 96 are selected at input terminals 98 to enable corresponding FETs 96. In one example embodiment, FETs 94a and 94b are selected to supply the mirror current $I_{MIRROR}$ conducted through node B which is greater than the reference current $I_{REF}$ conducted through node A by a factor of 1.5. Any suitable combination of FETs 94 can be enabled to provide currents which sum through node B. FETs 94 can be selected to provide currents which sum through node B and are less than the current through node A. Any suitable number of FETs 94 having any suitable gate widths W can be used.

Figure 8:
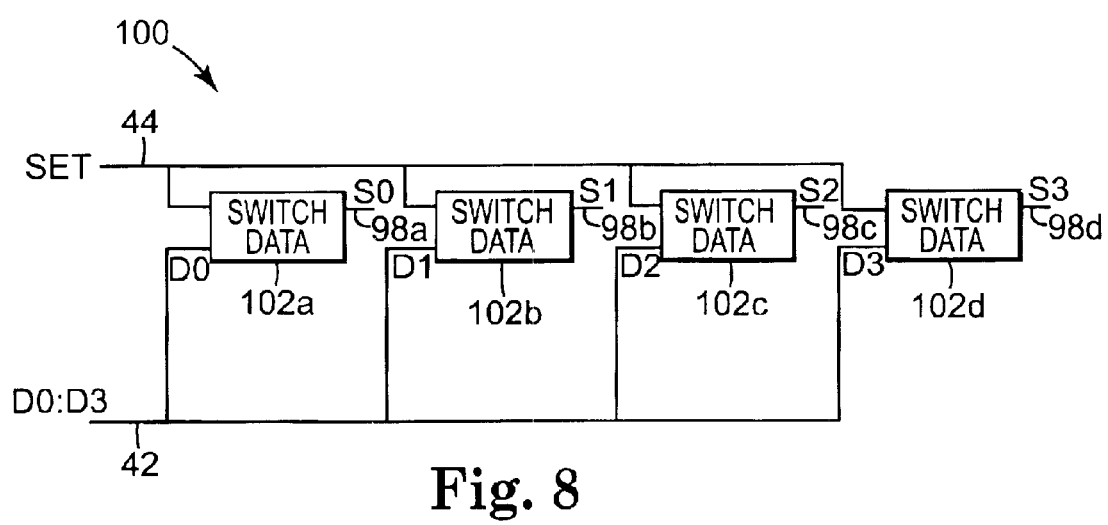
FIG. 8 is a schematic diagram illustrating a first embodiment of select logic which controls the current mirror sources illustrated in FIG. 7.

FIG. 8 is a schematic diagram illustrating a first embodiment of select logic which controls the current mirror source 164 illustrated in FIG. 7. In the embodiment illustrated in FIG. 8, switch data latches 102 are used to store select data corresponding to switches 96 which are desired to be energized to enable corresponding FETs 94. The select data corresponds to the predefined value or the first or second predefined amounts. Switch data latches 102 have inputs D0 through D3 which are provided by controller 36. In other embodiments, the switch data D0 through D3 can be provided by any suitable source, which can include either an "on-chip" or "off-chip" source. The output of switch data latches 102 at illustrated as S0 through S3 at outputs 98 corresponds to the data stored within the corresponding switch data latches 102. A set input at 44 is coupled to each switch data latch 102 and is used to strobe the switch data D0 through D3 received on lines 42 into switch data latches 102.

In various embodiments, other suitable numbers of switch data latches 102 can be used which correspond to other suitable numbers of switches 96 and FETs 94. In the first embodiment illustrated in FIG. 8, switch data latches 102 receive switch data from controller 36. In other embodiments, switch data latches 102 receive switch data from other sources within information storage device 10, or from an off-chip source. In other embodiments, switch data latches 102 include logic which can be preset during the information storage device 10 fabrication process, or which can be selected after fabrication by using approaches which include but are not limited to, fuses or anti-fuses.

Figure 9:
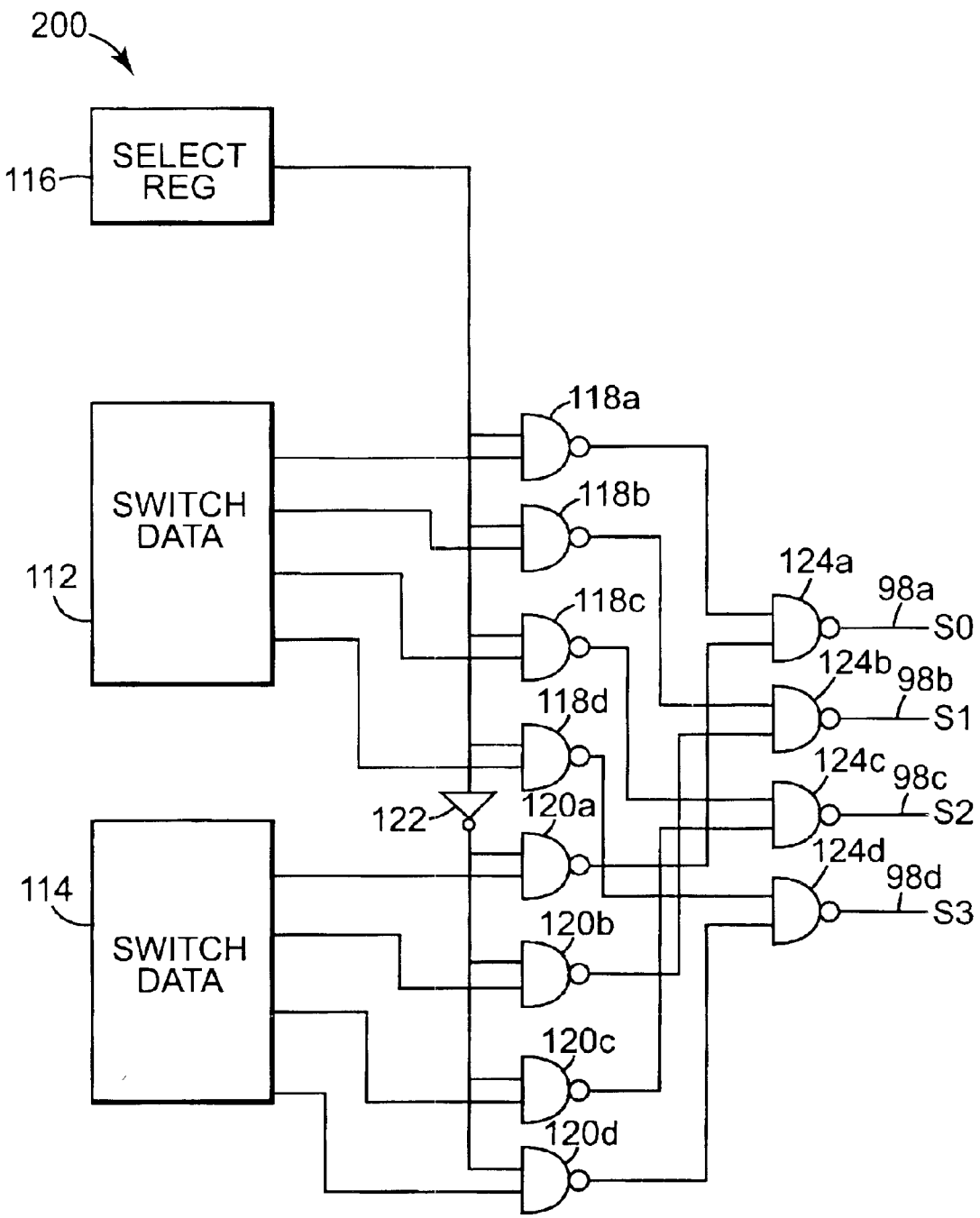
FIG. 9 is a schematic diagram illustrating a second embodiment of select logic which controls the current mirror sources illustrated in FIG. 7.

FIG. 9 is a schematic diagram illustrating a second embodiment of select logic which controls the current mirror source 164 illustrated in FIG. 7. FIG. 9 illustrates a first switch data register at 112 which is configured to provide a first set of outputs S0 through S3 at 98 to select corresponding select switches 96. A second switch data register at 114 is configured to provide a second set of outputs S0 through S3 at 98 to select corresponding select switches 96.

In the first embodiment, first switch data register 112 and second switch data register 114 are used to store first and second switch data which corresponds to the first and second predefined amounts or the predefined value. Select register 116 stores a first or second logic state which is used to select either the first switch data register 112 or the second switch data register 114. In various embodiments, the first or second logic state stored in select register 116 can be provided by controller 36, from other sources within information storage device 10, or from an off-chip source. In other embodiments, select register 116 includes logic which can be set in the first or second logic state during the information storage device 10 fabrication process, or which can be set after fabrication by using approaches which include but are not limited to, fuses or anti-fuses. In the second embodiment illustrated in FIG. 9, select register 116 selects between outputs of first switch data register 112, or outputs of second switch data register 114, by providing an output to logic gates 118 and an inverted output to logic gates 120. Logic gates 118 and 120 are coupled through logic gates 124 to outputs 98a through 98d. In other embodiments, other suitable storage sizes or numbers of switch data registers can be used to store switch data which is provided to outputs 98.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. An information storage device, comprising:

first and second memory cells which store complementary first and second logic states; and an error detection system coupled to the first and second memory cells, the error detection system configured to indicate an error if a difference between a first current flowing through the first memory cell and a second current flowing through the second memory cell is less than a predefined value.

2. An information storage device, comprising:

first and second memory cells which store complementary first and second logic states; and an error detection system coupled to the first and second memory cells, the error detection system configured to indicate an error if a difference between a first current flowing through the first memory cell and a second current flowing through the second memory cell is less than a predefined value, wherein the error detection system includes:

a read amplifier configured to compare the first current and the second current;

a first current source coupled to the first memory cell and configured to provide a first increased current which is equal to the sum of the first current and the predefined value;

a first amplifier coupled to the first current source and configured to compare the second current to the first increased current; and comparison logic configured to provide a first indication if the difference between the second current and the first current is less than the predefined value.

3. The information storage device of claim 2, wherein the error detection system includes:

a second current source coupled to the second memory cell and configured to provide a second increased current which is equal to the sum of the second current and the predefined value; and a second amplifier coupled to the second current source and configured to compare the first current to the second increased current, wherein the comparison logic is configured to provide a second indication if the difference between the first current and the second current is less than the predefined value.

4. The information storage device of claim 3, wherein the error detection system indicates the error if the comparison logic provides the first or the second indication.

5. The information storage device of claim 4, wherein the first and second current sources are variable current sources which include a storage register which stores data corresponding to the predefined value, wherein the first and second current sources are configured to provide the first increased current and the second increased current corresponding to the predefined value.

6. An information storage device, comprising:

a first and second memory cell storing complementary first and second logic states;

a read circuit configured to compare a first value measured from the first memory cell to a second value measured from the second memory cell and provide a first result;

a first error threshold circuit configured to compare the second value to a first increased value and provide a second result, wherein the first increased value is equal to the sum of the first value and a first predefined amount;

a second error threshold circuit configured to compare the first value to a second increased value and provide a third result, wherein the second increased value is equal to the sum of the second value and a second predefined amount; and a comparison circuit configured to compare the first result to the second result and the third result and provide an error indication if the first result is different than the second result or the third result.

7. The information storage device of claim 6, wherein the read circuit includes:

a read differential amplifier having first and second input nodes.

8. The information storage device of claim 7, wherein the first error threshold circuit includes:

a first data current mirror source coupled to the first node and configured to supply a data current to a third node which corresponds to the first increased value;

a first reference current mirror source coupled to the second node and configured to supply a reference current to a fourth node which corresponds to the second value; and a first error differential amplifier coupled to the third and fourth nodes and configured to compare the second value to the first increased value and provide the second result.

9. The information storage device of claim 8, wherein the second error threshold circuit includes:

a second data current mirror source coupled to the first node and configured to supply a data current to a fifth node which corresponds to the first value;

a second reference current mirror source coupled to the second node and configured to supply a reference current to a sixth node which corresponds to the second increased value; and a second error differential amplifier coupled to the fifth and sixth nodes and configured to compare the first value to the second increased value and provide the third result.

10. The information storage device of claim 9, wherein the comparison circuit includes:

logic coupled to the read differential amplifier, the first error differential amplifier and the second error differential amplifier and configured to provide the error indication if the first result is different than either the second result or the third result.

11. The information storage device of claim 10, wherein the first result is different from the second result if a difference between the second and first value is less than a difference between the second value and the first increased value when the first memory cell is storing a first logic state, and wherein the first result is different from the third result if a difference between the first and second value is less than a difference between the first value and the second increased value when the first memory cell is storing a second logic state.

12. The information storage device of claim 11, wherein the first and second values are voltage values.

13. The information storage device of claim 11, wherein the first and second values are current values.

14. The information storage device of claim 11, wherein the first predefined amount is equal to the second predefined amount.

15. An error detection circuit for an information storage device, wherein the information storage device includes a resistive cross point memory cell array, the circuit comprising:

a read differential amplifier having first and second input nodes coupled to a first and second memory cell in the memory cell array, wherein the read differential amplifier is configured to compare a first and second current flowing through the first and second nodes to determine if the first memory cell is storing the first or second logic state, wherein the first logic state corresponds to the second current being greater than the first current and the second logic state corresponds to the first current being greater than the second current;

a first data current mirror source configured to supply a third mirror current to a third node which is greater than the first current by a first predefined amount;

a first reference current mirror source which is configured to supply a fourth mirror current to a fourth node which is equal to the second current;

a first error differential amplifier coupled to the third and fourth nodes and configured to compare the fourth and third currents to determine if the second current is greater than the first current by at least the first predefined amount; and a first comparison circuit coupled to the read differential amplifier and the first error differential amplifier and configured to provide a first indication if the second current is not greater than the first current by at least the first predefined amount and the first memory cell is storing the first logic state.

16. The error detection circuit of claim 15, further comprising:

a second data current mirror source which is configured to supply a fifth mirror current to a fifth node which is equal to the first current;

a second reference current mirror source which is configured to supply a sixth mirror current to a sixth node which is greater than the second current by a second predefined amount;

a second error differential amplifier coupled to the fifth and sixth nodes and configured to compare the fifth and sixth currents to determine if the first current is greater than the second current by at least the first predefined amount; and a second comparison circuit coupled to the read differential amplifier and the second error differential amplifier and configured to provide a second indication if the first current is not greater than the second current by at least the second predefined amount and the first memory cell is storing the second logic state.

17. The error detection circuit of claim 16, wherein the comparison circuit includes:

a third comparison circuit coupled to the first and second comparison circuits and configured to indicate a read error if the first comparison circuit provides the first indication or the second comparison circuit provides the second indication.

18. The error detection circuit of claim 17, wherein the first data current mirror source and the second reference current mirror source or the second data current mirror source and the first reference current mirror source each include a reference transistor having a width W and a mirror transistor having a width $\alpha W$, wherein the reference transistor conducts the first or second current and the mirror transistor is configured to conduct a current which is less than, equal to, or greater than the first or second current by a factor α.

19. The error detection circuit of claim 17, wherein the first data current mirror source and the second reference current mirror source or the second data current mirror source and the first reference current mirror source each include a reference transistor and a plurality of selectable mirror transistors, wherein the reference transistor conducts the first or second current and the plurality of mirror transistors are configured to be selectively enabled by corresponding energized select switches to supply a mirror current which is less than, equal to, or greater than the first or second current.

20. The error detection circuit of claim 19, further comprising a storage register coupled to the plurality of select switches, wherein the storage register is configured to store switch data and selectively energize one or more of the select switches which correspond to the stored switch data.

21. The error detection circuit of claim 20, wherein the first data current mirror source and second reference current mirror sources include:
first address register configured to store first switch data;
second address register configured to store second switch data; and
select logic coupled to the select switches and configured to select either the first or the second address register to selectively energize one or more of the select switches which correspond to either the first or second stored switch data.

22. The error detection circuit of claim 16, wherein the first predefined amount is equal to the second predefined amount.

23. A method of detecting a read error, comprising:
providing a first and second memory cell which store complementary first and second logic states; and
indicating a read error if a difference between a first and second current flowing through the first and second memory cell is less than a predefined value.

24. A method of detecting a read error from a first and second memory cell which store complementary first and second logic states, comprising:
comparing a first value measured from the first memory cell to a second value measured from the second memory cell and providing a first result;
comparing the second value to a first increased value and providing a second result, wherein the first increased value is equal to the sum of the first value and a first predefined amount;
comparing the first value to a second increased value and providing a third result, wherein the second increased value is equal to the sum of the second value and a second predefined amount; and
comparing the first result to the second result and the third result and providing an error indication if the first result is different than the second result or the third result.

25. A method of detecting a read error in an information storage device which includes a resistive cross point memory cell array, comprising:
comparing a first and second current flowing through first and second nodes coupled to first and second memory cells in the memory cell array to determine if the first memory cell is storing the first or second logic state, wherein the first logic state corresponds to the second current being greater than the first current and the second logic state corresponds to the first current being greater than the second current;
supplying a third mirror current to a third node which is greater than the first current by a first predefined amount;
supplying a fourth mirror current to a fourth node which is equal to the second current;
comparing the fourth and third currents to determine if the second current is greater than the first current by at least the first predefined amount; and
providing a first indication if the second current is not greater than the first current by at least the first predefined amount and first memory cell is storing the first logic state.

26. The method of claim 25, further including:
supplying a fifth mirror current to a fifth node which is equal to the first current;
supplying a sixth mirror current to a sixth node which is greater than the second current by a second predefined amount;
comparing the fifth and sixth currents to determine if the first current is greater than the second current by at least the first predefined amount; and providing a second indication if the first current is not greater than the second current by at least the second predefined amount and the first memory cell is storing the second logic state.

* * * * *